United States Patent

Moline et al.

[11] Patent Number: 5,528,202
[45] Date of Patent: Jun. 18, 1996

[54] DISTRIBUTED CAPACITANCE TRANSMISSION LINE

[75] Inventors: Daniel D. Moline; Robert P. Davidson, both of Chandler, Ariz.

[73] Assignee: Motorola, Inc., Schaumburg, Ill.

[21] Appl. No.: 363,200

[22] Filed: Dec. 23, 1994

Related U.S. Application Data

[63] Continuation of Ser. No. 935,944, Aug. 27, 1992, abandoned.

[51] Int. Cl.⁶ .................................................. H03H 7/38
[52] U.S. Cl. ........................................ 333/33; 333/246
[58] Field of Search .......................... 333/24 C, 33, 333/35, 204, 246, 243

[56] References Cited

U.S. PATENT DOCUMENTS

| | | | |
|---|---|---|---|
| 2,915,716 | 12/1959 | Hattersley | 333/246 |
| 3,676,807 | 7/1972 | Boer | 333/81 A |
| 4,054,910 | 10/1977 | Chou et al. | 358/86 |
| 4,204,129 | 5/1980 | Hutchins | 307/147 |
| 4,539,617 | 9/1985 | Delaney et al. | 361/58 |
| 4,789,840 | 12/1988 | Albin | 329/161 |
| 4,954,791 | 9/1990 | Koenig | 332/164 |
| 4,970,478 | 11/1990 | Townley | 333/81 R |
| 4,987,391 | 1/1991 | Kusiak, Jr. | 333/24 C X |
| 5,014,023 | 5/1991 | Mantele | 333/164 |
| 5,032,738 | 7/1991 | Vithayathil | 307/112 |
| 5,144,206 | 9/1992 | Butler et al. | 315/248 |

FOREIGN PATENT DOCUMENTS

| | | | |
|---|---|---|---|
| 0059602 | 4/1983 | Japan | 333/161 |
| 0003201 | 1/1985 | Japan | 333/204 |
| 229501 | 11/1985 | Japan | 333/204 |

OTHER PUBLICATIONS

C. S. Aitchison et al., Lumped Microwave Circuits: Part 3 Filters And Tunnel–Diode Amplifiers, Nov. 1971, vol. 9, No. 2 pp. 46–51.

*Primary Examiner*—Paul Gensler
*Attorney, Agent, or Firm*—Rennie W. Dover; Bradley J. Botsch, Sr.

[57] ABSTRACT

A technique for achieving impedance transformations utilizing transmission lines has been provided. This technique involves placing additional distributed capacitance along the length of a transmission line thereby reducing the effective characteristic impedance of the transmission line. The effective wavelength for the transmission line is also reduced thereby substantially reducing the electrical length of a quarter wavelength matching network and making the transmission line practical and effective even at low frequencies.

8 Claims, 1 Drawing Sheet

DISTRIBUTED CAPACITANCE TRANSMISSION LINE

This application is a continuation of prior application Ser. No. 07/935,944, filed Aug. 27, 1992, now abandoned.

FIELD OF THE INVENTION

This invention relates to transmission lines and, in particular to a transmission line having an additional distributed capacitance for providing increased flexibility for performing impedance transformations.

BACKGROUND OF THE INVENTION

Transmission lines are utilized, and typically preferred, for many impedance matching applications. For example, RF power amplifier transistors have an extremely low die impedance. As a result, in order for the die to be useful, this low impedance must be transformed to a higher impedance. Thus, a transmission line may be utilized to transform a low die impedance (typically less than 1 ohm) up to a more useful and practical impedance such as 50 ohms.

In an attempt to provide a more practical impedance for an end-user, the device manufacturer may utilize low pass filter matching elements such as inductors and capacitors to increase the inherently low die impedance to a more suitable intermediate impedance. However, wire bonds represent series inductors and because of such low impedances of the device, the height and length of the wire bonds (which affect inductances) must be tightly controlled. In addition, an end user may then utilize various structures and components to raise the intermediate level impedance to his desired impedance such as 50 ohms. Some of the various structures and components that may be used are chip capacitors, air wound inductors and transmission lines. However, these structures and components are typically prone to assembly variation such as solder wicking on the components and positioning tolerances.

Transmission lines are useful in that they avoid many of the above-mentioned problems associated with discrete components. However, a problem with transmission lines is that at low frequencies the line length of transmission lines are impractical, and at low impedances the line width of transmission lines become impractical.

Hence, there exists a need for an improved transmission line technique for providing an impedance transformation from a low impedance up to a more practical impedance that is practical and reliable.

DETAILED DESCRIPTION OF THE DRAWINGS

A conventional transmission line is characterized by the following well known equations.

$$Z_0 = \sqrt{L/C} \quad (1)$$

$$\lambda = 1/(F\sqrt{LC}) \quad (2)$$

where

L and C are the inherent distributed inductance and capacitance per unit length of the transmission line;

$Z_0$ is the characteristic impedance of the transmission line;

F is the frequency of operation; and $\lambda$ is the wavelength in unit length according to a given frequency.

If an additional discrete capacitor (C_SHUNT) is added in shunt with a transmission line, EQNs. 1 and 2 are modified as follows.

$$Z_0 = \sqrt{L/(C+C\_SHUNT)} \quad (3)$$

$$\lambda = 1/[F\sqrt{L(C+C\_SHUNT)}\,] \quad (4)$$

where C_SHUNT is the shunt capacitance and expressed in capacitance per unit length.

From observing EQNs. 3 and 4, it should be apparent that with the addition of a shunt capacitor, both the characteristic impedance and the wavelength of the initial transmission line are reduced with respect to EQNs. 1 and 2. Further, by reducing the wavelength, a quarter wave length transmission line is made substantially shorter and thus more practical.

Figure 1:
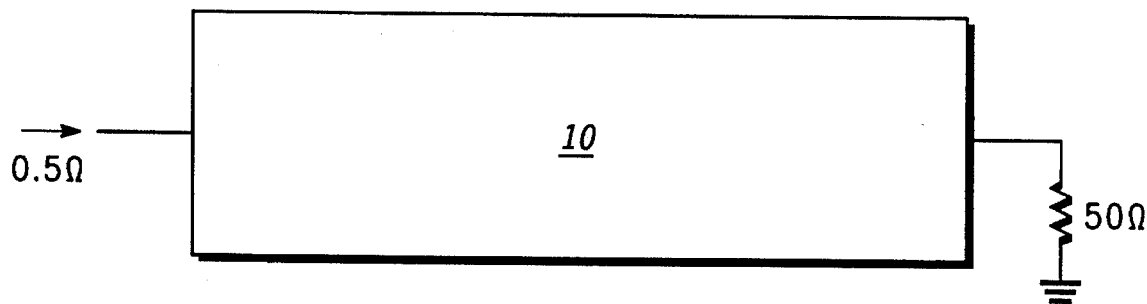
FIG. 1 is a pictorial diagram illustrating a "to scale" representation of a typical transmission line for providing a 0.5 ohm to 50 ohm impedance transformation.

The practical significance of the additional discrete capacitor (C_SHUNT) as expressed in EQNs. 3 and 4 is best demonstrated by way of example wherein the below example assumes that a glass Teflon board is used having a relative permittivity (dielectric constant) substantially equal to 2.55. Assume an operating frequency (F) equal to 470 MHz wherein at this frequency the use of a transmission line for matching is marginal because the signal wavelength at this frequency is substantial and approximately equal to 16.6 inches. Further, it is understood that although the transmission line is designed for a frequency of 470 MHz, some suitable frequency range does exist at the cost of small mismatches. Thus, a quarter wavelength matching transmission line is over 4.1 inches. Assume that it is desired to perform a transmission line function, for example, to provide an impedance transformation from a 0.5 ohm resistance to a 50 ohm resistance. The characteristic impedance ($Z_0$) of the transmission line would need to be equal to $(0.5\times50)^{1/2+1}$ which is equal to 5 ohms. Referring to FIG. 1, there is illustrated a "to scale" drawing of the required transmission line (10). In particular, transmission line 10 is approximately 1.3 inches wide and 4.1 inches long (one-quarter wavelength). As can be seen from FIG. 1, quarter wave transmission line 10 is probably impractical because it is quite wide and long and would utilize a substantial amount of space on a printed circuit board.

The design of the distributed capacitance transmission line in accordance with the present invention would proceed as follows. First select an arbitrary base transmission line such as a 20 ohm transmission line which would have a width of only 0.29 inches on glass Teflon as opposed to the 1.3 inches width for a 5 ohm transmission line wherein in general, as the impedance increases, the width of the transmission line decreases with all other variables remaining fixed.

Next, calculate the inherent distributed capacitance per unit length and the inherent distributed inductance per unit length of this 20 ohm transmission line.

$$C=1/(\lambda F Z_0)=1/(16.6 \text{ in.})(470 \text{ MHz})(20 \text{ ohms})=6.43 \text{ pF/in.} \quad (5)$$

$$L=Z_0/(\lambda F)=20 \text{ ohms}/(16.6 \text{ in.})(470 \text{ MHz})=2.57 \text{ nH/in.} \quad (6)$$

Now calculate the required additional distributed capacitance (C_SHUNT) to achieve a 5 ohm characteristic impedance transmission line since that is the correct impedance that we need to transform 0.5 ohms to 50 ohms $(0.5\times50)^{1/2+1}$ $$C\_SHUNT = L/(Z_0)^2 - C = 2.57 \text{ nH/in}/(5)^2 - 6.43 \text{ pF/in.} = 96.4 \text{ pF/in.} \quad (7)$$

Now calculate the new wave length for the distributed capacitance transmission line as shown in Equation 8.

$$\lambda = Z_0/(FL) = 5 \text{ ohms}/(470 \text{ MHz})(2.57 \text{ nH/in.}) = 4.14 \text{ in.} \quad (8)$$

Thus, for a quarter wave length transmission line the total distributed capacitance can be calculated as shown in Equation 9.

$$C\_SHUNT = (96.4 \text{ pF/in.})(4.14 \text{ in.}/4) = 99.8 \text{ pF} \quad (9)$$

Thus, a capacitance of approximately 100 picoFarads (pF) distributed along the 1.03 ($\lambda/4$) inch transmission line will yield a transmission line having a characteristic impedance substantially equal to 5 ohms and will only be 1.03 inches long. This can be implemented with either one 100 pF capacitor distributed across one side of the 20 ohm transmission line, or two 50 pF capacitors, one capacitor distributed across one side of the 20 ohm transmission line, and the other capacitor distributed across the other side of the 20 ohm transmission line. Further, it is to be understood that any number of capacitive elements may be coupled across transmission line 20 so as to provide the desired impedance transformation.

Figure 2:
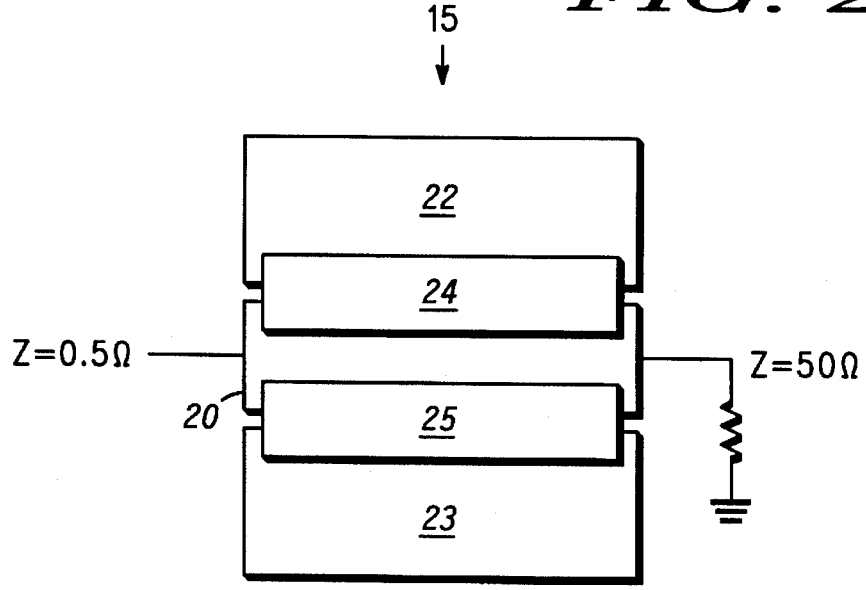
FIG. 2 is a pictorial drawing illustrating a "two times scale" representation of a distributed capacitance transmission line for providing a 0.5 ohm to 50 ohm impedance transformation in accordance with the present invention.

Referring to FIG. 2, a pictorial drawing illustrating a "two times scale" representation of distributed capacitance transmission line 15 for providing a 0.5 ohm to 50 ohm impedance transformation is shown. Transmission line 20 (which is drawn twice its actual size for clarity purposes) transforms a 0.5 ohm impedance to a 50 ohm impedance. Transmission line 20 by itself has a characteristic impedance of 20 ohms which is arbitrary as aforementioned wherein a higher characteristic impedance implies a narrower width line with all other variables unchanged. Further, ground pads 22 and 23 are shown whereby 50 pF capacitors 24 and 25 are coupled on each side of transmission line 20 between transmission line 20 and ground pads 22 and 23, respectively. Thus, even though transmission line 20 was initially a 20 ohm characteristic impedance, with the addition of shunt capacitors 24 and 25 distributed across the length of transmission line 20, the effective characteristic impedance of transmission line 20 is substantially equal to 5 ohms. This provides the correct impedance to transform 0.5 ohms to 50 ohms as desired. It should be obvious upon comparing FIGS. 1 and 2 and noting that transmission line 20 is drawn twice its actual size (for clarity purposes) that a significant size reduction has been achieved thereby making the use of a transmission line not only practical but efficient.

The present invention adds an additional distributed shunt capacitance along a conventional transmission line while leaving the inherent distributed inductance substantially unchanged. In doing so, the present invention provides the following benefits: the characteristic impedance of the conventional transmission line is substantially reduced and the effective required electrical length of the transmission line is shortened as illustrated by the above example. Further, the present invention has the effect of substantially increasing the effective dielectric constant of the medium on which the transmission line is fabricated. As a result, the present invention provides an improved method of providing impedance transformations at low frequencies and low impedance levels. Further, since the manufacture and design of transmission lines are easier to control than inductors and other matching elements, the present invention provides the impedance transformation with improved repeatability.

The present invention provides a method for providing an impedance transformation comprising the steps of (a) selecting a transmission line having a predetermined characteristic impedance and line width and for operating at a predetermined frequency; (b) calculating an additional distributed capacitance in order to transform the predetermined characteristic impedance of the transmission line into a desired characteristic impedance, the desired characteristic impedance being less than the predetermined characteristic impedance; and (c) distributing the capacitance calculated in step (b) across a predetermined electrical length of the transmission line, the predetermined electrical length being calculated with respect to the predetermined frequency and the desired characteristic impedance.

By now it should be apparent from the foregoing discussion that a novel technique for achieving impedance transformations utilizing transmission lines has been provided. This technique involves placing distributed capacitance along the length of a transmission line thereby reducing the effective characteristic impedance of the transmission line. The effective wavelength for the transmission line is also reduced thereby substantially reducing the electrical length of a quarter wavelength matching network.

While the invention has been described in conjunction with specific embodiments thereof, it is evident that many alterations, modifications and variations will be apparent to those skilled in the art in the light of the foregoing description. For example, a transmission line may take the form of stripline, co-axial, or microstrip. Accordingly, it is intended to embrace all such alterations, modifications and variations in the appended claims.

We claim:

1. A distributed capacitance transmission line for providing a transmission line function, comprising:

a transmission line which is comprised of a signal conductor and a reference conductor, wherein the transmission line is of a predetermined length, a first characteristic impedance, and a predetermined distributed inductance; and at least one discrete capacitor having a first terminal and a second terminal, said first terminal coupled to said predetermined length of said signal conductor of said transmission line and being distributed along an entire length of said predetermined length of said transmission line and said second terminal coupled to and distributed along an entire length of said predetermined length of said reference conductor of said transmission line, said at least one discrete capacitor allowing said transmission line to have an effective characteristic impedance which is less than said first characteristic impedance thereby minimizing a length of said transmission line, said predetermined distributed inductance of said transmission line remaining substantially unchanged.

2. A distributed capacitance transmission line for providing a transmission line function as claimed in claim 1, wherein the at least one discrete capacitor is a single discrete capacitor.

3. A distributed capacitance transmission line for providing a transmission line function as claimed in claim 1, wherein said reference conductor is coupled to a reference potential.

4. A distributed capacitance transmission line for providing a transmission line function as claimed in claim 3, wherein the at least one discrete capacitor is a single discrete capacitor.

5. A distributed capacitance transmission line for providing a transmission line function as claimed in claim 3, wherein said reference potential is a ground potential.

6. A method for providing an impedance transformation, the method comprising the steps of:

(a) selecting a transmission line comprised of a signal conductor and a reference conductor and having a predetermined characteristic impedance, line width, and a predetermined inductance for operating at a predetermined frequency;

(b) calculating a distributed capacitance in order to transform said predetermined characteristic impedance of said transmission line into a desired characteristic impedance, said desired characteristic impedance being less than said predetermined characteristic impedance;

(c) coupling a first terminal of at least one discrete capacitor to a predetermined electrical length of said signal conductor of said transmission line, said at least one discrete capacitor having a capacitance value substantially equal to the distributed capacitance calculated in step (b), said first terminal distributed along an entire length of said predetermined electrical length, said predetermined electrical length being calculated with respect to said predetermined frequency and said desired characteristic impedance, said predetermined distributed inductance of said transmission line remaining substantially unchanged; and (d) coupling a second terminal of the at least one discrete capacitor to and distributed along an entire length of said predetermined length of said reference conductor of said transmission line.

7. A method for providing an impedance transformation as claimed in claim 6, further including providing a ground conductor as the reference conductor.

8. A method for providing an impedance transformation as claimed in claim 6, further including using a single discrete capacitor as the at least one discrete capacitor.

* * * * *